United States Patent
Hagen et al.

(10) Patent No.: US 7,722,375 B2
(45) Date of Patent: May 25, 2010

(54) PLUG CONNECTION DEVICE DESIGNED TO CONNECT TWO FUNCTION ELEMENTS FOR SIGNAL AND POWER TRANSMISSION

(75) Inventors: Juergen Hagen, Erlangen (DE); Martin Hemmerlein, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/271,086

(22) Filed: Nov. 14, 2008

(65) Prior Publication Data

US 2009/0130885 A1 May 21, 2009

(30) Foreign Application Priority Data

Nov. 15, 2007 (DE) .................. 10 2007 054 592

(51) Int. Cl.
*G01V 3/00* (2006.01)
(52) U.S. Cl. ...................... 439/310; 324/318
(58) Field of Classification Search ................ 439/289, 439/71, 950, 310, 320; 235/451; 333/242; 324/318, 322, 307, 309; 600/421, 422, 420
See application file for complete search history.

(56) References Cited

U.S. PATENT DOCUMENTS

| 3,587,031 | A | * | 6/1971 | Flavin et al. ............... 439/260 |
|---|---|---|---|---|
| 3,635,184 | A | * | 1/1972 | Liautaud ..................... 114/51 |
| 3,795,885 | A | * | 3/1974 | Desso et al. ................. 439/67 |
| 4,250,536 | A | * | 2/1981 | Barringer et al. ............ 361/787 |
| 4,470,100 | A | * | 9/1984 | Rebaudo et al. ............. 361/785 |
| 5,292,267 | A | * | 3/1994 | Kobayashi et al. .......... 439/310 |
| 5,416,414 | A | * | 5/1995 | Mansfield et al. ........... 324/318 |
| 5,432,486 | A | | 7/1995 | Wong |
| 5,490,797 | A | * | 2/1996 | Durgin ...................... 439/310 |
| 5,583,525 | A | * | 12/1996 | Nekomoto et al. ........... 345/1.2 |
| 5,684,673 | A | * | 11/1997 | Shibasaki et al. ........ 361/679.42 |
| 5,782,645 | A | * | 7/1998 | Stobie et al. ................ 439/289 |
| 5,786,979 | A | | 7/1998 | Douglass |
| 6,024,579 | A | * | 2/2000 | Bennett ...................... 439/66 |
| 6,038,138 | A | * | 3/2000 | Dayton et al. ............... 361/796 |
| 6,290,524 | B1 | * | 9/2001 | Simmel ..................... 439/289 |
| 6,320,384 | B1 | * | 11/2001 | Doty et al. .................. 324/321 |
| 6,353,746 | B1 | * | 3/2002 | Javitt ........................ 455/66.1 |
| 6,447,339 | B1 | * | 9/2002 | Reed et al. .................. 439/638 |
| 6,498,730 | B2 | * | 12/2002 | Centola et al. .............. 361/759 |
| 6,611,702 | B2 | * | 8/2003 | Rohling et al. .............. 600/415 |
| 6,781,391 | B2 | * | 8/2004 | Reed et al. .................. 324/754 |
| 6,891,447 | B2 | | 5/2005 | Song |
| 6,958,608 | B2 | * | 10/2005 | Takagi et al. ................ 324/318 |
| 7,098,661 | B2 | * | 8/2006 | Nistler et al. ............... 324/318 |
| 7,138,801 | B2 | * | 11/2006 | Yamamoto et al. .......... 324/318 |
| 7,221,163 | B2 | * | 5/2007 | Vester ....................... 324/318 |
| 7,235,974 | B2 | * | 6/2007 | Nistler et al. ............... 324/318 |

(Continued)

FOREIGN PATENT DOCUMENTS

EP  0 668 634  8/1995

(Continued)

*Primary Examiner*—T C Patel
*Assistant Examiner*—Vladimir Imas
(74) *Attorney, Agent, or Firm*—Schiff Hardin LLP

(57) ABSTRACT

A plug connection device that connects two function elements for signal and power transmission between the function elements, in particular for medical applications, has connection components fashioned for capacitive connection of the function elements.

5 Claims, 3 Drawing Sheets

U.S. PATENT DOCUMENTS

| | | | |
|---|---|---|---|
| 7,291,032 B1 * | 11/2007 | Carver et al. | 439/310 |
| 7,356,952 B2 * | 4/2008 | Sweeney et al. | 40/446 |
| 7,364,452 B2 * | 4/2008 | Carver et al. | 439/310 |
| 7,458,815 B2 * | 12/2008 | Fallah-Adl et al. | 439/61 |
| 7,576,542 B1 * | 8/2009 | Lvovsky | 324/318 |
| 7,605,587 B2 * | 10/2009 | Takeshima | 324/307 |
| 2002/0173717 A1 * | 11/2002 | Rohling et al. | 600/415 |
| 2003/0207604 A1 * | 11/2003 | Burger et al. | 439/310 |
| 2004/0090231 A1 * | 5/2004 | Augustine et al. | 324/309 |
| 2007/0001673 A1 * | 1/2007 | Augustine et al. | 324/307 |
| 2007/0167867 A1 * | 7/2007 | Wolf | 600/561 |
| 2009/0209852 A1 * | 8/2009 | Mate et al. | 600/431 |

FOREIGN PATENT DOCUMENTS

| | | |
|---|---|---|
| EP | 1 647 038 | 2/2008 |
| WO | WO 87/02161 | 4/1987 |

\* cited by examiner

PLUG CONNECTION DEVICE DESIGNED TO CONNECT TWO FUNCTION ELEMENTS FOR SIGNAL AND POWER TRANSMISSION

BACKGROUND OF THE INVENTION

1. Field of the Invention

The present invention concerns a plug connection device designed to connect two function elements for signal and power transmission between the function elements, in particular for medical applications, as well as: a plug element, a medical device with a function element arrangement, and an associated method.

2. Description of the Prior Art

When two function elements should be connected with one another in order to transfer signals and power between them (for example function elements in medical devices, for example large medical apparatuses such as magnetic resonance tomography apparatuses and the like), galvanic plug contacts in the form of a combination composed of a plug and a socket have previously been used. These plug contacts are executed as pin contacts or coaxial contacts.

A problem associated with such galvanic plug contacts is that they are relatively expensive and are prone to a certain failure susceptibility. For example, pins can bend and coaxial contacts that are contaminated negatively affect the functional reliability. The lifespan of the galvanic plug contacts is limited. Due to wear, only a limited number of plug cycles can be expected. Additionally, a certain force must be applied for plugging and unplugging.

SUMMARY OF THE INVENTION

An object of the present invention is to provide a plug connection device that is improved with regard to the above aspects.

This object is achieved in accordance with the present invention by a plug connection device fashioned for capacitive connection of the function elements.

The connection of the function elements—for example of a body coil used in magnetic resonance tomography, which body coil rests on a patient—with the associated patient bed is thus realized not as previously, based on a galvanic function principle, but rather based on a capacitive effect principle. The plug connection device (wherein the term "plugging" is used herein as establishing a connection in the broadest sense) thus has electrodes that are separable from one another and that can store electrical charge and therefore energy, so that a capacitance is developed. It is thereby possible to produce a transmission of signals and power.

The capacitive principle offers the advantage that lifespan limitations due to wear that exist for galvanic plug contacts can be avoided. Additionally, no plug forces must be applied in the zero-force plugging according to the invention.

In comparison to the previous principles with galvanic plug contacts, the capacitive principle exhibits a higher function reliability and a lower probability of defects; defects in previous galvanic contacts arising due to bent pins or unclean coaxial contacts, for example.

Furthermore, the capacitive plug connection offers the advantage that cables can largely be foregone. For example, in magnetic resonance systems wireless coils or coil parts as function elements offer the advantage of the coils being more easily manipulated. For example, wireless point-to-point connections of multi-part coils (for example a top coil part and a bottom coil part) can be achieved. Problems are therefore avoided that could occur, for example, forgetting to plug in the upper part (for example the head coil) via cables was forgotten. The coil volume can be reduced overall by omitting the cables, and corresponding plug panels on a patient bed can be done away with.

Accordingly, the term "plug connection" is used herein in a very general sense in the scope of the present invention. It does not encompass a plug with galvanic contacts, but generally concerns a connection device for two function elements, wherein by the term "plug connection" means that, by bringing at least one such function element into spatial proximity, with the other plug connection must make signal and power transmission between the two function elements (capacitively) possible. At the least, a conventional plug element with the typical design of a male part and a female part is in not necessary for realization of the plug connection device according to the invention.

How the plug connection is realized in detail is secondary to the fact that the fundamental principle that is employed is the capacitive principle. The structural embodiments of the plug connection device according to the invention thus can take many different forms.

According to the invention, the plug connection device can basically be composed of multiple (in particular four) components for establishing the connection between the function elements, or can embody such multiple components. Given four components, two of these components are respectively associated with a function element, and can be integrated into the function element.

Multiple (in particular four) parts or components can be used, wherein two (different) components are respectively associated with a single function element and two additional components (that can correspond to the components of the first function elements with regard to the basic design) are respectively associated with the other function element.

A component does not necessarily need to be fashioned as one structural part. Rather, the division into components is to be understood as meaning that these are constituent parts that fulfill different functions. One component can accordingly be formed of multiple parts that fulfill a similar or identical function.

Ultimately, a plug connection in the form of a plug module or connection module is generated by the multi-component design.

Furthermore, the plug connection device (connection device) can have a circuit board associated with a function element and a component associated with the circuit board, this component having coupling elements for making a connection between the function elements, or the plug connection device, or the connection device can be composed of these components.

In this embodiment, a module is thus fashioned in which a circuit board with an associated component with coupling elements is provided for one function element. For the other function element, the plug connection device likewise has two components (namely a circuit board as well as a component with correction elements). The respective components associated with the respective function elements can be integrated into those function elements. For example, a circuit board to accommodate electronic modules together with a component with coupling elements can be integrated into a coil, for example a coil of a magnetic resonance device as a function element, while a further component with coupling elements with a corresponding circuit board can be located in a patient bed of a magnetic resonance device.

The inventive use of circuit boards in a plug module offers the advantage of space savings and simultaneously offers a reduction of the installation time due to a high level of integration.

At least one component with coupling elements can be fashioned with an array of coupling elements. In this case the coupling elements thus form a field—possibly of a number—of coupling elements, wherein the number of coupling elements will be equally large in both components with coupling elements for effective realization of the capacitive connection.

At least one component with coupling elements that is associated with a circuit board can be designed in multiple parts. This means that the coupling elements are not necessarily arranged on a single substrate or a single board or the like, but rather that multiple parts (as boards, rods etc.) that each have a single coupling element or a limited number of coupling elements can be provided that together form the component with coupling elements. These can be dielectric substrate materials, due to the use of the capacitive principle.

At least one component with coupling elements can be fashioned from band-like or rod-like (in particular parallel) parts with multiple coupling elements, in particular coupling elements arranged in the longitudinal direction along the length of the band or rod, and/or at least one component with coupling elements can be fashioned from (in particular essentially rectangular) parts forming the coupling element.

There are thus diverse possibilities as to how the individual parts of a multi-part component with coupling elements can be formed. In particular, band-like or rod-shaped parts—thus band-like or rod-shaped substrates (in particular shaped as flat bars) for the coupling elements—can be provided, for example in the form of thin plates of various coupling elements applied on the plates along the length thereof. The coding components can be applied on the bands or plates by gluing, for example or by positively mount, or can be connected with the plate in another manner (for example mechanically).

Furthermore, a number of (for example rectangular) parts can be provided (for example as boards) that thus each exhibit a specific basic shape, with a single coupling element being arranged on each part. Naturally, other appropriate designs (not explicitly cited here) of the individual parts of the components with coupling elements or arrangements of the coupling elements on such a part are possible.

According to the invention, at least one component with coupling elements that is designed in multiple parts can have at least two (entirely) unconnected parts, or can be composed exclusively of unconnected parts. It is thus possible for a component with coupling elements to be formed of various thin (band-like or rod-like) plates that are not connected with one another, with these plates arranged or set up merely by a connection with an associated circuit board, or, by their attachment in a function element in a specific manner relative to one another (for example in parallel).

Furthermore, at least one component with coupling elements (or at least one part of a component with coupling elements) that is associated with a circuit board can be soldered to the circuit board. In this case a (permanent) connection with the associated circuit board is established, advantageously by soldering but possibly in another manner. In the event that multi-part components with coupling elements are present, the individual parts of these components are then brought into a specific position relative to one another or, respectively, are generally secured in their respective positions or orientations.

At least one component with coupling elements that is associated with a circuit board can otherwise (thus apart from the coupling elements) be formed of at least partially of a ceramic material. The coupling elements can be electrode elements (made of copper, for example), and an associated substrate material or base module on which the coupling elements are arranged can be formed of a ceramic material. Material mixtures or additional constituents are naturally also possible, but the use of a homogenous ceramic material as a dielectric is normally suitable.

The ceramic material can exhibit a high relative permittivity, in particular a relative permittivity significant greater than 100. A low-resistance connection with a high capacitance on a small surface can be achieved via such a ceramic with a high relative permittivity. A material with a relative permittivity of $\in_r \gg 100$ is preferably used.

At least one circuit board can be fashioned to accommodate at least one electronic module (in particular an adaptation circuit and/or an amplifier) and/or can have at least one cable and/or at least one plug for signal relaying (in particular on a surface). Different electronic modules thus can be integrated into the circuit board of a plug module based on the capacitive active principle according to the invention, or the components can be housed in this circuit board or be arranged on this. Furthermore, the circuit board can carry elements for signal relaying, such as cables, plugs and the like, on an (external) surface.

The plug connection device can be fashioned at least in part for integration in a conventional plug element and/or in the function elements to be connected.

In principle, there are thus two different possibilities for realization of the (plug) connection device according to the invention, namely in the form of a conventional plug element, or integrated into such a plug element, or directly integrated into the function elements to be connected, for example a bed and a local coil in magnetic resonance tomography.

Naturally, the plug connection device does not have to be entirely integrated into a conventional plug element (which can possibly serve to mechanically secure a connection), nor need the plug connection device be completely housed in a function element. It is also possible for the plug connection device to merely be fitted in part into a function element, for example. Under the circumstances, combinations of the two basic designs of the integration into a conventional plug element and the integration into the function elements to be connected are also conceivable.

According to the invention, the plug connection device can be fashioned to connect function elements in magnetic resonance tomography, in particular a patient bed and a local coil. The plug connection device thus can be used predominantly in the medical field, but naturally the applications are not limited to this field. However, the use of such capacitive connection elements or plug is particularly suitable for magnetic resonance tomography, in particular with regard to the advantages of wireless coils and coil parts, to provide a better manipulability as well as a lower probability of error. The capacitive connection is additionally more cost-effective and, given corresponding design, plug panels on the patient bed (as have previously been typical) can be foregone.

For each transmission channel, the plug connection device is fashioned with two capacitors in each of the forward and return lines. This is the basic design that is required for the signal and power transmission according to the invention.

Furthermore, the plug connection device can be fashioned for four-channel connection of function elements, in particular with 2n channels. Coils used today are often multi-channel coils, with ever greater channel numbers occurring as development proceeds. According to the invention, a capacitive connection can be realized not only in coils with two or four channels but also in coils with 6, 8, 16 or 32 or more channels. Clusters for use in, for example, multi-channel coils for magnetic resonance tomography or for other multi-channel applications can thus be realized with a connection module or plug module according to the invention.

The plug connection device is advantageously fashioned with planar terminals. Such planar terminals, for example between ceramics (the components with coupling elements) prevent an air gap from occurring between these components so that a low-resistance connection is realized. In generally, planar terminals for connection by simple placement one atop the other, any secure connection establishment, are suitable.

According to the invention, a cleaning unit to remove possible contaminations can be associated with the plug connection device. This cleaning unit can be coupled with a line or other suitable movement function so that the contact surfaces or connection units or additional components of the plug connection device are cleaned by a cleaning agent (for example a brush or the like) being moved linearly or in another manner over the components or surfaces to be cleaned.

Such a cleaning unit or cleaning device can be provided directly at the plug connection device (for example as an associated or integrated part) or can be present separately, thus not in a directly connected or integrated manner. The cleaning advantageously ensues directly before each reconnection of the two function elements, possibly automatically (for example by means of a suitable actuator). Particularly in the case of an integrated cleaning unit, the cleaning should be compulsory, by a brush being automatically moved across the (free) surfaces of the plug connection, for example.

The respective circuit board associated with a function element to be connected and/or the associated component with coupling elements can be adapted in terms of shape to the circuit board associated with the other function element and/or the associated component with coupling elements, in particular to produce a positive connection.

A mechanical fixing of the connection can be achieved (similar to as with a conventional plug element) by a design adapted with regard to shape, in particular of the opposing components with coupling elements that are associated with the two different function elements to be connected. A correct relative positioning or arrangement of the elements that are respectively associated with different function elements is thereby ensured. Furthermore, slippage of the plug connection or, respectively, of the connection components against one another can be prevented. At the same time, even in the case of a positive design of the individual components with regard to the components of the respective other function element, a simple connection establishment can nevertheless be enabled by placement one atop the other, or placement one inside the other, or the like.

The respective circuit board associated with a function element to be connected and/or the associated component with coupling elements can be adapted in terms of shape to the circuit board associated with the other function element and/or the associated component with coupling elements by formation of at least one convexity and/or at least one projection and/or at least one recess, in particular by formation of at least one convexity and/or at least one projection and/or at least one recess with a polygonal (in particular triangular or quadrilateral) and/or a curved cross-sectional area.

It is thus appropriate for a component with coupling elements (such as a ceramic plate on which copper elements are attached for coupling) to exhibit a convexity or swell, for example in a middle region in the direction of the other function element, in particular without reducing the thickness—for example a triangular or sawtooth convexity. The component of the other function element then advantageously has a complementary shaped counterpart, for example a surface contour with a matching indentation. For example, a securing of the connection against displacement or against sliding can be achieved by a formation of mating shapes, such as convexities or projections or recesses or (at least in segments) uneven surfaces. The placement of individual connection parts one atop the other, which connection parts are respectively associated with different function elements, is thereby supported by the establishment of a positive fit in a simple manner.

The invention also concerns a plug element that is fashioned with a plug connection device as described in the preceding. In this case, the plug connection according to the invention is integrated into a plug element, for example such that the plug connection is inserted into a conventional plug or a conventional plug module, with the establishment of an electrical contract being combined with the mechanical fixing by the plug elements through the integration into such a conventional plug.

Moreover, the invention concerns a medical device with a function element arrangement with at least two function elements connected with one another by means of a plug connection device as described above. For example, the medical device can be a magnetic resonance tomography apparatus that has different function elements, for example a patient bed and a local coil or even multiple local coils that can be connected with the patient bed by means of a plug connection device as explained above. In particular integration of the plug connection device into the function elements to be connected can be provided. The medical device or the medical apparatus thus has a function element arrangement into which a plug connection device as described in the preceding is integrated for signal and power transmission.

Furthermore, the invention concerns a method for signal and power transmission between two function elements, in particular in medical applications, for example in magnetic resonance tomography apparatuses in which the signal and power transmission ensues by means of a plug connection device as explained above (thus based on the capacitive principle). Signals and/or power thus can be transmitted purely capacitively between function elements (such as local coils and a patient bed and the like) without the previously typical galvanic contacts being necessary. Wear can therefore be kept low, and a zero-force plugging with a simultaneously higher functional reliability and fewer defects overall are additionally possible.

DESCRIPTION OF THE PREFERRED EMBODIMENTS

Figure 1:
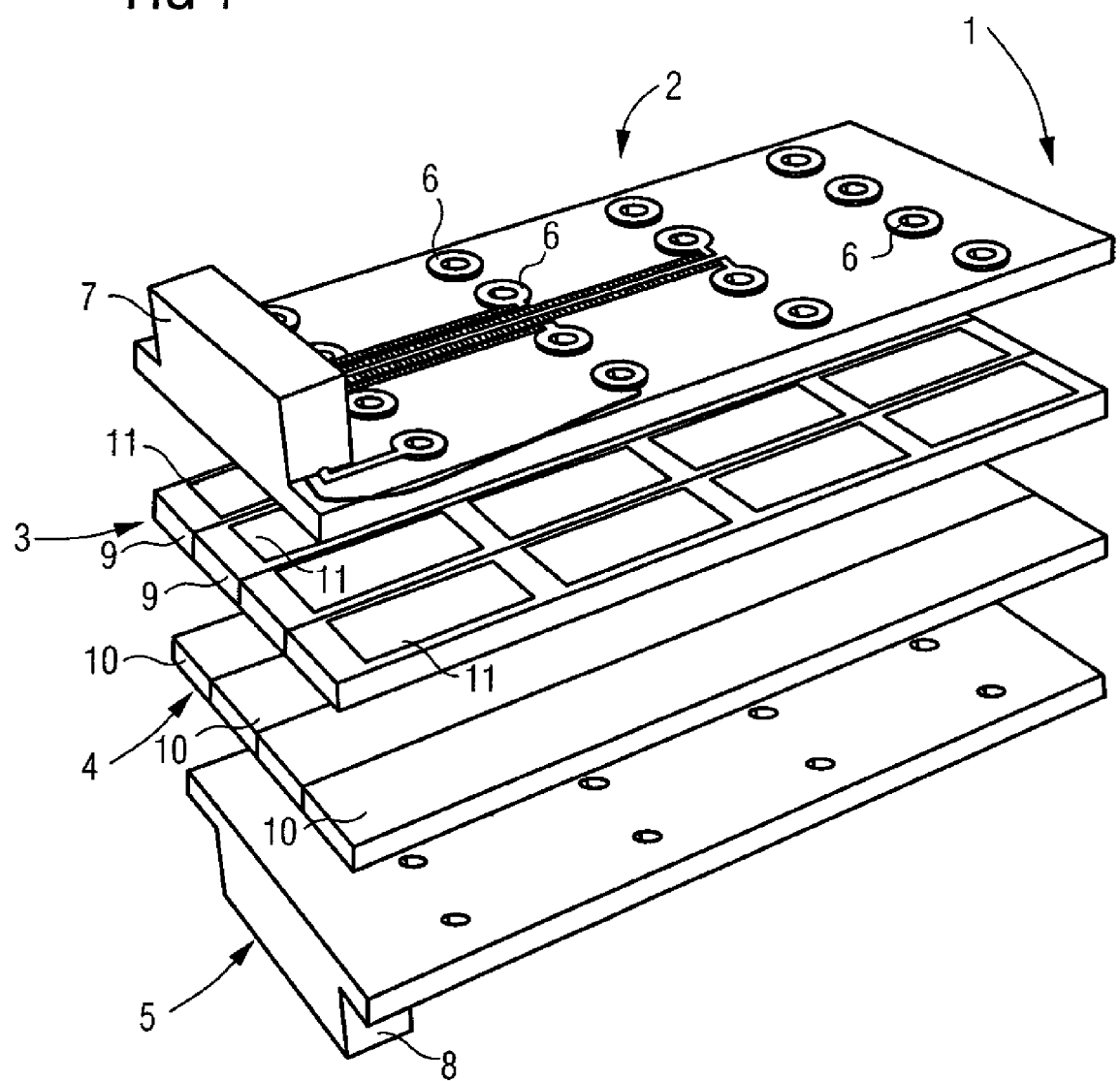
FIG. 1 is an exploded view of a plug connection device according to the invention.

FIG. 1 shows an exploded view of a plug connection device 1 according to the invention. The plug connection device 1 is constructed from four components: a circuit board 2; a component 3 with coupling elements that is provided below the circuit board 2 in this embodiment; a subsequent additional component 4 with coupling elements; and the circuit board 5 associated with the component 4.

The circuit boards 2, 5 are provided with different electronic components, among others with conductor traces 6. For connection to a medical device, a plug element 7 is provided on the circuit board 2 that corresponds to a plug element 8 on the circuit board 5. The components 3, 4 with coupling elements are respectively multi-partite, made up of plate-like or flat bar-like elements 9 and 10 that are not connected with one another and are only affixed against one another due to the attachment to the respective circuit boards 2, 5.

The individual parts 9, 10 carry a number of coupling elements 11 on their respective sides facing toward the respective circuit boards 2, 5. The coupling elements of the component 4 with coupling elements are not visible in the representation shown here and accordingly are also not provided with a reference character. The coupling elements 11 are respectively soldered to the adjoining sides or the adjoining surfaces of the circuit boards, 2, 5. The capacitive plug connection device 1 of the invention exhibits the advantage that it is significantly more cost-effective and less prone to failure in comparison to the previous galvanic contacts. The installation on the circuit boards 2, 5 offers the advantage of a significant space savings with a simultaneous reduction of the installation time due to the high level of integration that is therefore provided.

The parts 9, 10 of the components 3, 4 with coupling elements 11 are formed of a ceramic material with a high relative permittivity in order to realize a low-resistance connection with a high capacitance on a smaller surface. The coupling elements 11 are formed of copper. Naturally, in other exemplary embodiments different electrode materials or different dielectrics can also be used.

Figure 2:
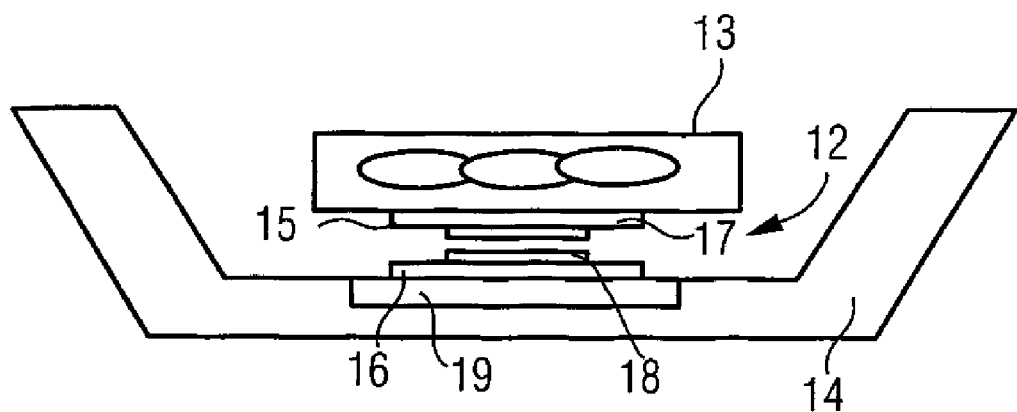
FIG. 2 shows a plug connection device according to the invention for adaptation of a local coil antenna to a patient bed of a magnetic resonance device.

A plug connection device 12 according to the invention for adaptation of a local coil antenna 13 to a patient bed 14 of a magnetic resonance device is shown in FIG. 2. The local coil antenna 13 is provided for a spine examination in which the patient lies on the coil. The plug connection device 12 is redesigned as a multi-component module with two circuit boards 15, 16 and two ceramic elements 17, 18. Coupling elements (not shown in detail here) are located on the ceramic elements 17, 18. An electronic box 19 from which the signals are relayed to a signal processing electronic adjoins the lower circuit board 16 on the side of the patient bed 14.

The local coil arrangement 13 can thus be wirelessly adapted to the patient bed 14.

Figure 3:
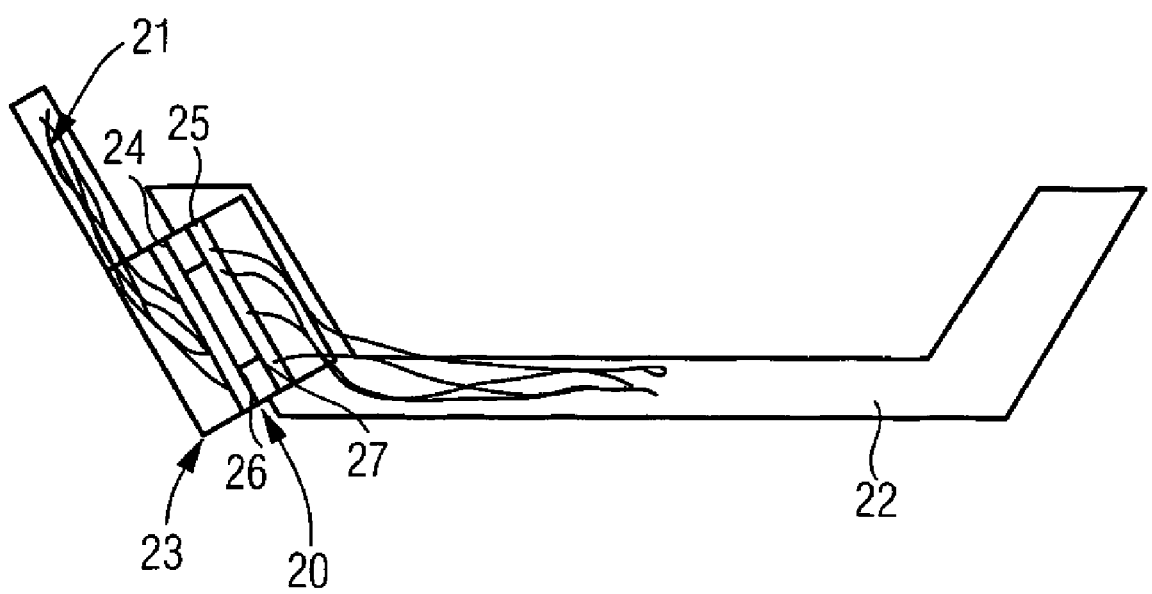
FIG. 3 shows a further plug connection device according to the invention, for connection of a local coil and a patient bed of a magnetic resonance device.

An additional plug connection device 20 according to the invention is shown in FIG. 3. A local coil (of which here only the feed lines 21 are shown) is also connected according to the invention to a patient bed 22 for signal and power transmission via this plug connection 20. The local coil that is connected here is a type known as a body coil that is placed on the patient in the operation of the magnetic resonance device. The plug connection device 20 is integrated into a flat plug 23 as a plug element in order to achieve not only an electrical contacting but also simultaneously a reliable mechanical fixing. The plug connection device 20 is again fashioned with two circuit boards 24 and 25 and two ceramic elements 26 and 27 that bear the coupling elements (not shown here).

Figure 4:
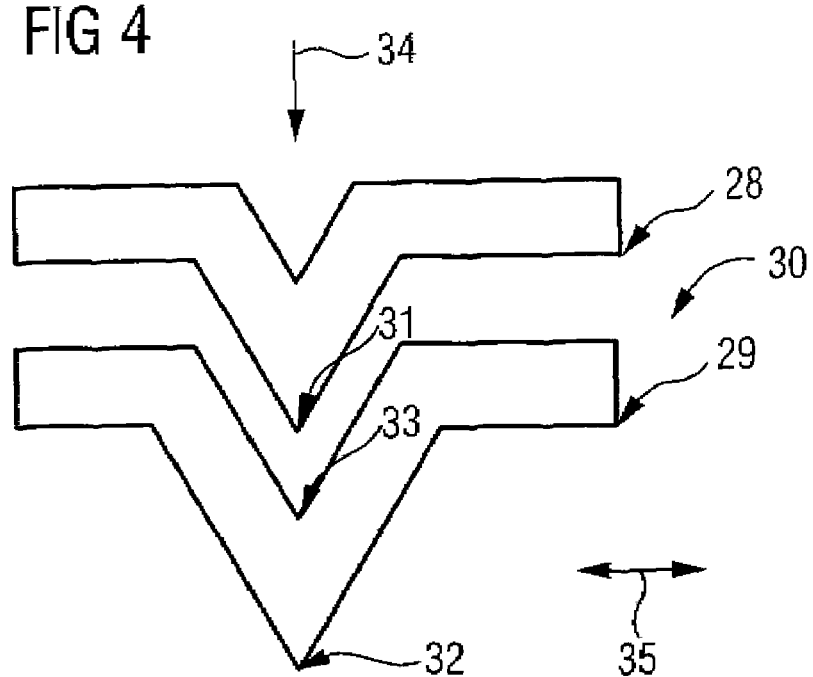
FIG. 4 is an embodiment of a positive design of components of a plug connection device according to the invention.

FIG. 4 shows a depiction of the positive design of components 28 and 29 of a plug connection device 30 according to the invention. The two components 28 and 29 are respectively associated with one of the two function elements to be connected.

The components 28, 29 shown in longitudinal section respectively have, in a middle region, a convexity (here extending across the entire width of the components) with a triangular cross-section profile, such that, upon placement of the components 28, 29 one atop the other, the convexity of the upper component 28 (indicated with reference character 31) engages in the recess 33 created by the convexity 32 of the lower component 29. The process of placement of the components 28 and 29 one atop the other so that a positive connection is created by the convexity 31 in cooperation with the recess 33 is indicated by the arrow 34. A sliding of the components against one another, in particular in the longitudinal direction indicated by the double arrow 35, is prevented by the positive design of the two components 28 and 29.

Figure 5:
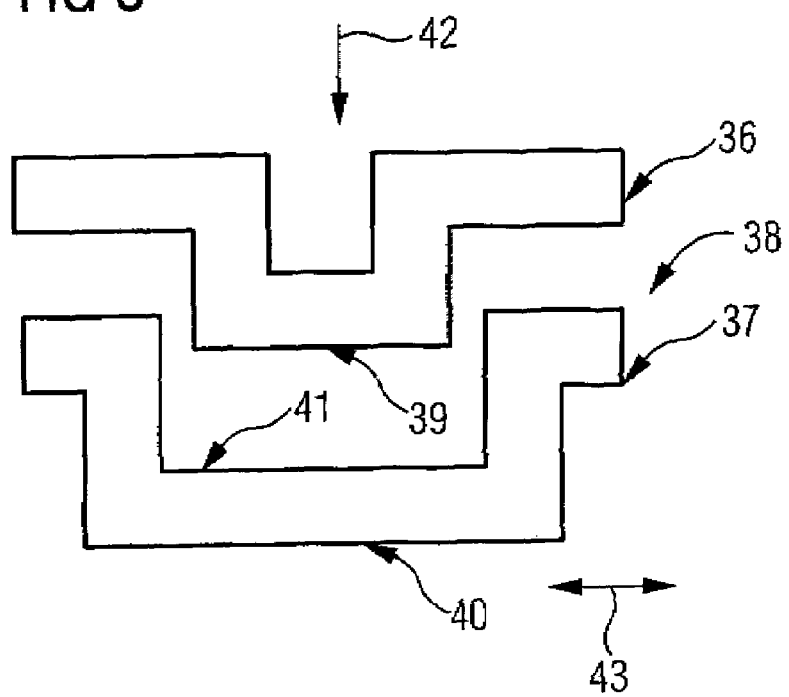
FIG. 5 is a further embodiment of a positive design of components of a plug connection device according to the invention.

FIG. 5 shows an additional representation of a positive design of components 36 and 37 of a plug connection device 38 according to the invention. In this case, the components 36 and 37 exhibit respective projections 39 and 40 that, in the section representation shown here, have a U-shape or rectangular shape. The projection 39 again engages in the recess 41 created by the projection 40 of the component 37. If the components 36 and 37 are placed one atop the other according to the direction of the arrow 42, a sliding in the direction of the double arrow 43 is no longer possible due to the positive embodiment.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus patient bed comprising:
    a bed platform adapted to receive an examination subject thereon;
    a local coil adapted for placement on the examination subject on the patient bed, said local coil being configured to radiate radio-frequency energy into, or to detect magnetic resonance signals emanating from, the examination subject on the patient bed;
    a first circuit board having an electrical connection to said local coil;
    a first ceramic element having an electrical connection to said first circuit board and having a first capacitive coupling element therein;
    a second ceramic element spaced from said first ceramic element and carried by said patient bed, said second ceramic element having a second capacitive coupling element therein;
    a second circuit board mounted on said patient bed having an electrical connection to said second ceramic element; and
    said first and second capacitive coupling elements forming a capacitive coupling path through which said RF energy is transmitted from said first circuit board to said second circuit board or through which said detected magnetic resonance signals are transmitted from said first circuit board to said second circuit board.

2. A patient bed as claimed in claim 1 wherein said first ceramic element comprises a plurality of first capacitive coupling elements and said second ceramic element comprises a plurality of second capacitive coupling elements, said plurality of first capacitive coupling elements and said plurality of second capacitive coupling elements forming said capacitive coupling.

3. A patient bed as claimed in claim 2 wherein said plurality of first capacitive coupling elements are arranged in a first array in said first ceramic element and wherein said plurality of second capacitive coupling elements are arranged in a second array, conforming to said first array, in said second ceramic element.

4. A patient bed as claimed in claim 3 wherein said array of said first capacitive coupling elements and said array of said second capacitive coupling elements form $2^n$ channels for transmission of said RF energy or said magnetic resonance signals.

5. A patient bed as claimed in claim 1 wherein each of said first and second ceramic elements is comprised of ceramic material having a relative permittivity that is substantially larger than 100.

* * * * *